United States Patent [19]

Humpston et al.

[11] Patent Number: 5,106,009
[45] Date of Patent: Apr. 21, 1992

[54] METHODS OF JOINING COMPONENTS

[75] Inventors: Giles Humpston, Croxley Green; David M. Jacobson, Wembley, both of England

[73] Assignee: Marconi Electronic Devices Limited, United Kingdom

[21] Appl. No.: 578,542

[22] Filed: Sep. 4, 1990

[30] Foreign Application Priority Data

Sep. 6, 1989 [GB] United Kingdom ................ 8920101

[51] Int. Cl.⁵ ............................................. B23K 31/00
[52] U.S. Cl. ................... 228/195; 228/124; 228/231
[58] Field of Search ............................. 228/193–195, 228/123, 124, 198, 231

[56] References Cited

U.S. PATENT DOCUMENTS 3,769,101 10/1973 Woodward ................. 148/127
4,826,787  5/1989 Muto et al. .................. 228/193

FOREIGN PATENT DOCUMENTS 0119691 9/1984 European Pat. Off. .
1386395 4/1988 U.S.S.R. ..................... 228/195

OTHER PUBLICATIONS

"Applications of solid–liquid Interdiffusion (SLID) bonding in integrated-circuit applications", by L. Bernstein et al., Transactions of the Metallurgical Society, vol. 236, Mar. 1966, pp. 405–412.

"Semicondcutor joining by the Solid-Liquid-Interface (SLID) Process", by L. Bernstein, Journal of Electrochemical Society, vol. 113, No. 12, Dec. 1966, pp. 1282-1288.

Primary Examiner—Samuel M. Heinrich
Attorney, Agent, or Firm—Kirschstein, Ottinger, Israel & Schiffmiller

[57] ABSTRACT

A method of joining components by soldering comprising forming discrete layers of silver (13, 17) and another metal (19), e.g. a tin or indium based material, the two layers having volumes in a ratio different from that in the eutectic alloy formed by silver and that metal, and raising the temperature of the layers above the melting point of the eutectic alloy for a period sufficient to cause initially formation of the eutectic alloy and then, by reaction between the eutectic alloy and one or other of silver and the other metal, formation of a material having a melting point higher than the eutectic alloy melting point. The method allows soldering, e.g. of a silicon wafer (1) to a header (3), at a relatively low temperature below that which the joint will withstand after formation.

15 Claims, 2 Drawing Sheets

METHODS OF JOINING COMPONENTS

BACKGROUND OF THE INVENTION

1. Field of the Invention

This invention relates to methods of joining components.

More particularly the invention relates to methods of joining components by soldering, suitable for use in joining a silicon wafer to a component of molybdenum or tungsten.

2. Description of Related Art

Such methods find application in the manufacture of high power silicon semiconductor devices. In such devices the electrical connections to the silicon wafer in which the device is formed are conventionally made by way of relatively massive copper electrodes, one on each side, which also serve to conduct heat away from the wafer. Ideally the wafer would be bonded directly to these copper electrodes. In practice the difference between the thermal expansion coefficients of copper and silicon renders this impracticable. Instead, one main face of the wafer is conventionally brazed to a molybdenum or tungsten backing plate, normally in the form of a disc, and a dry sliding contact between one copper electrode and the disc is made. The other copper electrode makes a dry sliding contact with another molybdenum disc which in turn makes a dry sliding contact with the main face of the water remote from the brazed disc, the wafer being unable to withstand the stress associated with two brazed joints.

In conventional high-power silicon semiconductor device manufacturing processes the wafer is brazed to the disc using an Al-12%wtSi braze the melting point of which is 577° C. The use of a braze of such a high melting point introduces stresses in the brazed assembly which give rise to bowing. This can be largely removed by clamping under pressure in the final encapsulated package, but the stresses remain and these can impair performance of the device.

SUMMARY OF THE INVENTION

It is an object of the present invention to provide a method of joining components which alleviates the above described problem.

According to the present invention there is provided a method of joining components comprising the steps of: providing between the components discrete layers each consisting either substantially of silver or substantially of another metal, there being at least one layer of each metal, the silver and another metal in said layers having total volumes in a ratio different from that in a eutectic alloy formed by silver and said another metal; and raising the temperature of said layers above the melting point of said eutectic alloy for a period sufficient to cause initially formation of said eutectic alloy and then, by reaction between said eutectic alloy and one or other of silver and said another metal, formation of a material having a melting point higher than said temperature.

In one particular embodiment of the invention said another metal is tin or a tin based material.

In another particular embodiment of the invention said another metal is indium or an indium based material.

It will be appreciated that the advantage of the present invention lies in that it enables a joint to be made at a temperature lower than that required to remelt the joint after being formed.

BRIEF DESCRIPTION OF THE DRAWINGS

Several methods in accordance with the invention will now be described, by way of example, with reference to the accompanying drawings in which.

DETAILED DESCRIPTION OF THE PREFERRED EMBODIMENTS

The methods to be described by way of example essentially comprise joining a first component, e.g. of silicon, to a second component e.g. of molybdenum or tungsten either directly, or via an intermediate component of a metal e.g. an iron-nickel alloy which is readily plated with the jointing metals, i.e. silver and another metal which forms a eutectic with silver e.g. indium or tin. Prior to forming the joint the relevant face of the first component is provided with metallizations which are non-reactive with silver at the temperatures employed in forming the joint and subsequent service of the joint and are adherent to, and where the first component is of silicon, form an ohmic contact with, silicon. The relevant face of the second component and the third component, if present, is similarly provided, prior to forming the joint, with metallizations which are non-reactive with silver and adherent to the material of the component. Layers of the jointing metals are then provided between the metallized surfaces of the components to be joined, and the components assembled and heated under pressure for a time which is a function of the thicknesses of the layers of jointing metals employed.

Figure 1:
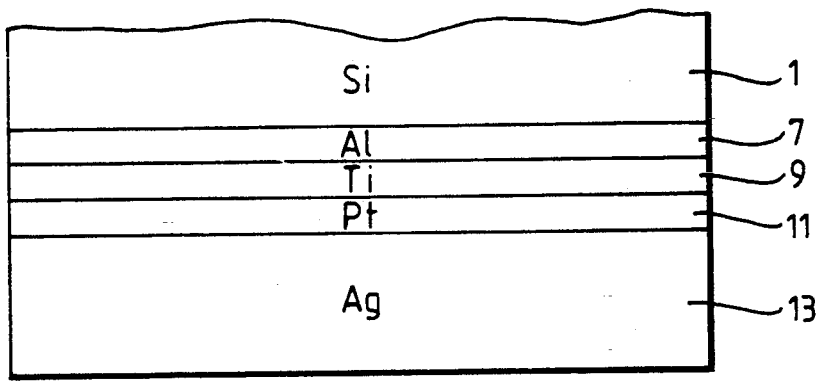
FIG. 1 is a diagram illustrating first and second methods.
Figure 1:
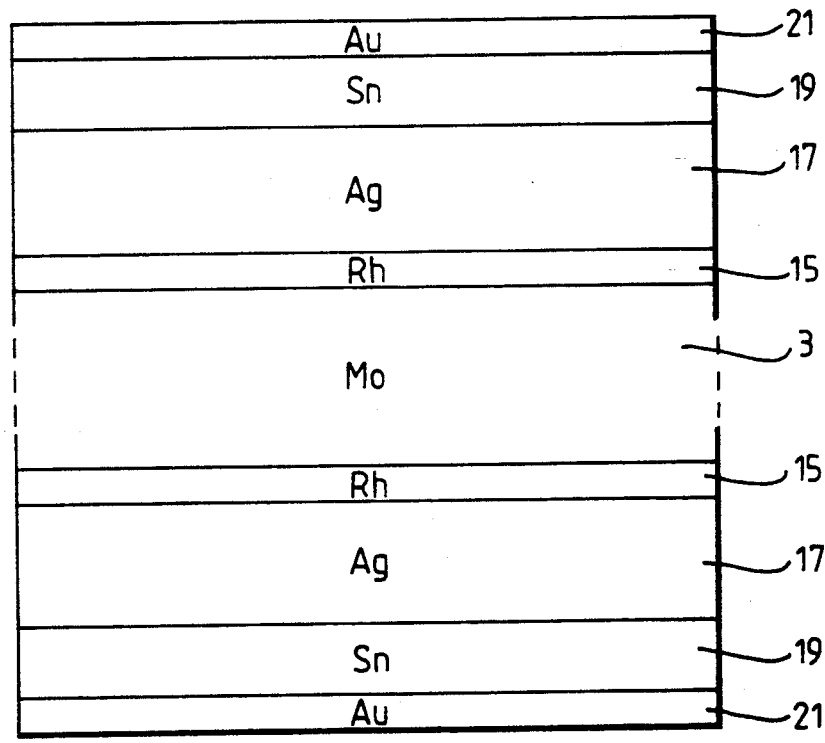
Figure 1:
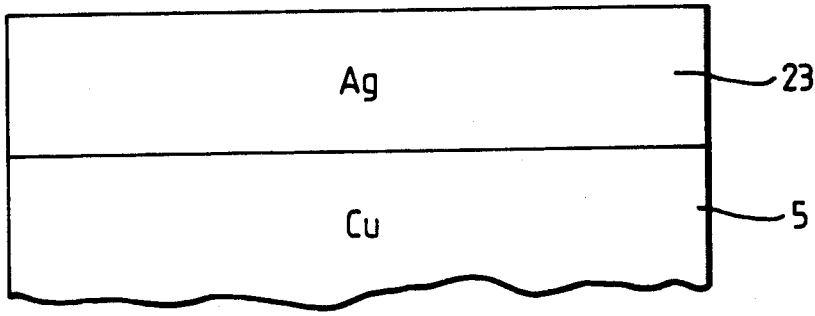

Referring to FIG. 1, in the first method to be described one main face of a 9 mm diameter silicon wafer 1 containing a diode structure is joined to one main face of a molybdenum disc 3 of the same diameter while the other main face of the disc 3 is simultaneously joined to a copper electrode 5.

Prior to the joining operation the relevant main face of the wafer 1 is first provided with a metallization comprising a vapour deposited aluminum layer 7 of thickness about 1.0 μm which is heat treated to form a sintered ohmic contact with the silicon wafer 1. Layers 9 and 11 of titanium and platinum are then applied in turn over the aluminum layer 7, by vapour deposition, to provide a metallic layer for application of a jointing metal layer 13 of silver by electroplating. The layers 9 and 11 typically together have a thickness of about 0.5 μm and the layer 13 a thickness of from 5 to 10 μm.

The molybdenum disc 3 in its as supplied condition has on its surface a thin rhodium layer 15. To the rhodium layer 15 on each main face of the disc 3 there are applied, in turn, by electroplating, layers 17 and 19 of jointing metal consisting of silver and tin respectively, the layers 17 and 19 having thicknesses of about 10 μm and 5 μm respectively. The exposed faces of the tin layers 19 may, if desired, be provided with a protective gold flash 21.

The copper electrode 5 is provided on one main face with an electroplated silver layer 23 of thickness the same as the silver layer 13 carried by the silicon wafer 1.

To join the components 1, 3 and 5 together the components 1, 3 and 5 are assembled as shown in FIG. 1 and maintained at a temperature of 275° C. in a vacuum furnace for a period of about one hour under an applied pressure of 1 MPa.

The resulting joints between the silicon wafer 1 and the disc 3 and between the disc 3 and the copper electrode 5 are found to be capable of surviving a tensile load up to a temperature of about 600° C. Furthermore the joints are found to be capable of thermal cycling between 25° C. and 175° C. for more than 2500 cycles and heat treatment at 300° C. for 2,300 hours without any sign of failure.

The mechanism of joint formation is as follows. On heating to 275° C., i.e. above the melting point of the eutectic binary. alloy formed by silver and tin of 221° C., the silver and tin in layers 13, 17, 23 and 19 first form the eutectic binary alloy in liquid form. The compound $Ag_3Sn$ then forms by reaction between silver and the liquid phase Ag-Sn at the liquid-silver interface. By ensuring that the silver layers 13, 17, and 23 are sufficiently thick relative to the tin layers 19 to constitute 70% by volume of the total volume of the silver and tin layers, 13, 17, 23 and 19, i.e. much more than the volume proportion (3.5%) of silver in the eutectic alloy, and maintaining the joint temperature above 221° C. for a sufficient length of time to cause all the tin in the layers 19 to react to form $Ag_3Sn$ and leave a surplus of silver in the joints, the resulting joints will have a remelt temperature of more than 480° C., the melting point of $Ag_3Sn$. It has been found that the presence of $Ag_3Sn$ does not embrittle the joints. It will be appreciated that the theoretical maximum possible melting point of a joint is 980° C., the melting point of silver.

It will be appreciated that in the above method the thickness of the gold flashes 21 is critical. If they are too thick then the brittle compound $AuSn_4$ tends to form.

In the second method to be described, the procedure is as described above with reference to FIG. 1 except that the tin layers 19 are replaced by layers of indium about 6 μm thick, the gold flashes 21, if present, are replaced by silver flashes, and heating takes place at about 175° C., i.e. about 35° C. above the melting point of the eutectic binary alloy formed by silver and indium, for about two hours with an applied pressure of 0.3 MPa. The resulting joint is found to survive the application of a tensile load up to a temperature of about 900° C. The volume of silver is substantially 77% of the total volume of silver and indium in this particular method.

It will be understood that when the assemblies made as described above are packaged into a device the copper electrode 5 forms one heat sink electrode of the device while the other heat sink electrode (not shown) makes a dry sliding contact with the exposed surface of the silicon wafer 1.

Figure 2:
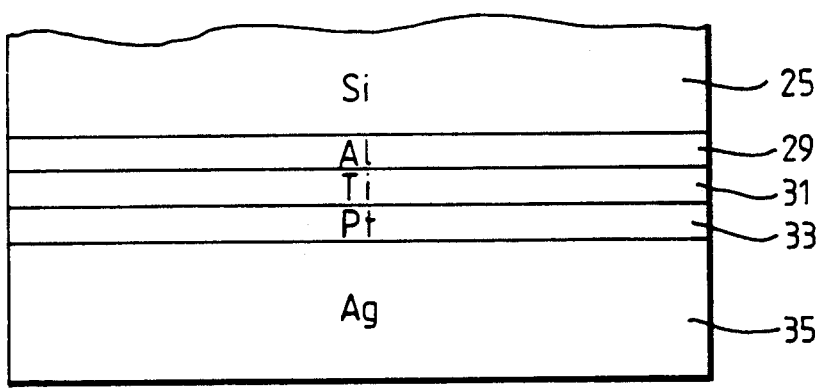
FIG. 2 is a diagram illustrating a third method.
Figure 2:
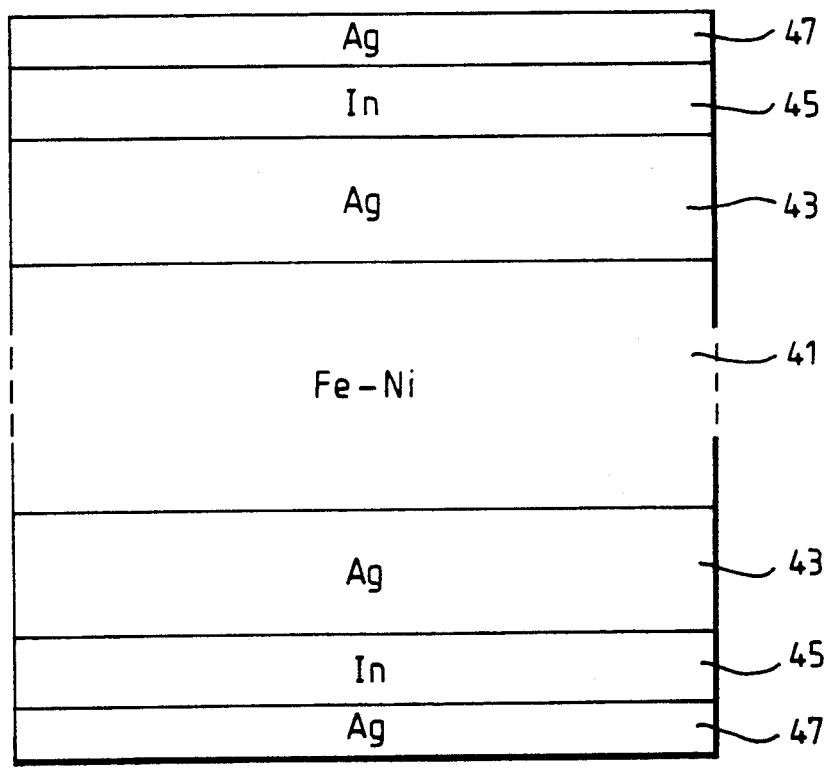
Figure 2:
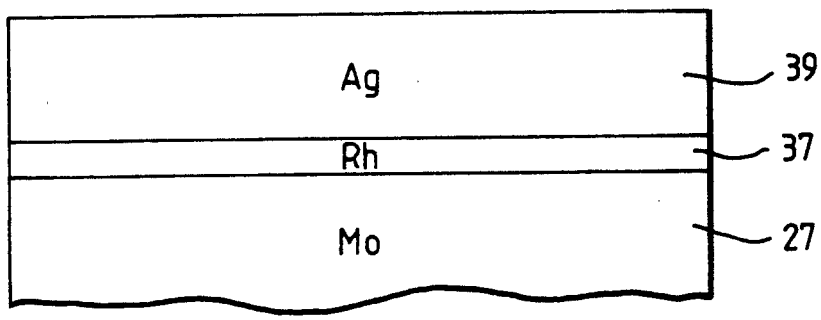

Referring now to FIG. 2, in the third method to be described by way of example, one main face of a silicon wafer 25 of diameter 50 mm is joined to one main face of a molybdenum disc 27 of the same diameter. In view of the relatively large diameter of the disc 27 joining of the other face of the disc 27 to a copper electrode is not practicable. Hence, dry sliding contact is made with the exposed faces of wafer 25 and disc 27 by copper electrodes (not shown) in the completed device. Consequently the disc 27 is initially provided with any conventional metallization (not shown) suitable when dry sliding contact with a copper electrode is required.

The silicon wafer 25 is provided on one main face with layers 29, 31, 33 and 35 of aluminum, titanium, platinum and silver corresponding to layers 7, 9, 11 and 13 described above with reference to FIG. 1.

The molybdenum disc 27 is provided on one main face over an as supplied rhodium layer 37 with an electroplated silver layer 39 of thickness equal to that of the silver layer 35 carried by the silicon wafer 25.

The other required jointing metal e.g. tin or indium, is introduced into the joint on a carrier in the form of a disc 41 of appropriate diameter of a metal that is readily plated with the jointing metal and is reasonably well expansion-matched to silicon over the working temperature range of the completed device, e.g. −50° C. to +250° C. An iron-nickel alloy such as Invar 42 is suitable.

The carrier disc 41 is thus provided on each main face with coatings 43, 45 and 47 of silver, indium and silver respectively of thicknesses 11, 3 and 0.1 μm respectively.

To join the components 25 and 27 together the components 25, 27 and 41 are assembled as shown in FIG. 2.

After heating at about 175° C. for about two hours under a pressure of 0.3 MPa joints are formed between carrier disc 41 and wafer 25 and carrier disc 41 and molybdenum disc 27 typically of thickness of only about 10 μm with an edge-to-edge bow of less than 6 μm. This compares with a bow typically of 60 μm for a corresponding assembly using a conventional Al-12%wtSi braze.

It will be appreciated that in the method of FIG. 2 the indium layers 45 may be replaced by tin layers, in which case the silver flashing layers 47 may be replaced by gold flashings.

In addition to the relatively low temperature required to make a joint by a method according to the invention, a method according to the invention has the advantage that even with relatively low pressure applied during formation of joints, the joints exhibit low incidence of voids in joints. This arises partly from the fact that only a small fraction of the total material within the zone of reaction, typically less than 25%, is liquid at any time. Hence the relative quantity of molten alloy expelled from a joint is smaller than in conventional soldering processes. The components joined are also clean and flat, unlike when a solder foil is used, and void levels due to trapped gases are reduced.

It will be appreciated that while in the examples described above the relative volumes of silver and tin or indium are such that all the tin or indium alloys with the silver leaving a surplus of silver in the joint, in other methods according to the invention a surplus of tin or indium may result. However, much higher joint remelt temperatures result where there is a surplus of silver in the joint since higher melting point phases form by the reaction between silver and tin or indium. When there is a surplus of tin or indium in the joint lower re-melt temperatures result since tin and indium have melting points close to the silver-tin and silver-eutectic melting points.

It is further pointed out that metals other than tin and indium, for example gallium, may be used with silver in a method according to the invention. The required features of the metal used with silver are of course that it forms with silver a eutectic of suitably low melting point and that it will react with the eutectic alloy or the eutectic alloy will react with silver without forming brittle compounds. Furthermore, the metal used with silver may be an alloy or combination of two or more metal elements i.e. a separate discrete layer of an alloy of two or more metal elements may be used or two or more separate discrete layers each consisting of a metal element or a metal alloy may be used. Similarly, a silver based discrete layer may be used instead of a substantially pure discrete silver layer.

It will further be understood that while the method according to the invention is particularly suitable for joining a silicon component to a component of molybdenum or tungsten, it finds application wherever it is desired to form a joint between two components which has a re-melt temperature higher than the temperature of formation of the joint.

We claim:

1. A method of joining components comprising the steps of: providing between the components discrete layers, each in the form of a coating applied to a respective said component or a said layer carried thereby, and each consisting either substantially of silver or substantially of another metal, there being at least one layer of each metal, the silver and another metal in said layers having total volumes in a ratio different from that in a eutectic alloy formed by silver and said another metal; and raising the temperature of said layers above the melting point of said eutectic alloy for a period sufficient to cause initially formation of said eutectic alloy and then, by reaction between said eutectic alloy and one or other of silver and said another metal, formation of a material having a melting point higher than said temperature.

2. A method according to claim 1 wherein the volume fraction of silver in said layers is greater than the volume fraction of silver in said eutectic alloy.

3. A method according to claim 1 wherein said another metal is tin or a tin based material.

4. A method according to claim 3 wherein said temperature is substantially 275° C.

5. A method according to claim 3 wherein the volume of silver in said layers is substantially 70% of the total volume of all said discrete layers together.

6. A method according to claim 1 wherein said another metal is indium or an indium based material.

7. A method according to claim 6 wherein said temperature is substantially 175° C.

8. A method according to claim 6 wherein the volume of silver in said layers is substantially 77% of the total volume of all said discrete layers together.

9. A method according to claim 1 wherein said period is between one and two hours.

10. A method according to claim 1 wherein both said components carry a said layer consisting substantially of silver.

11. A method according to claim 10 wherein a said layer of said another metal is carried on one only of said components.

12. A method according to claim 1 wherein one of said components consists substantially of silicon.

13. A method according to claim 12 wherein the surface of the silicon component to be joined is provided with a sintered aluminum layer overlaid by titanium and platinum layers.

14. A method according to claim 12 wherein the other of said components consists substantially of molybdenum or tungsten.

15. A method according to claim 12 wherein the other of said components consists substantially of an iron-nickel alloy.

* * * * *